| United States Patent [19] | [11] Patent Number: 4,995,047 |
| --- | --- |
| Hadley et al. | [45] Date of Patent: Feb. 19, 1991 |

[54] INTEGRATED INJECTION-LOCKED SEMICONDUCTOR DIODE LASER

[75] Inventors: G. Ronald Hadley; John P. Hohimer; Adelbert Owyoung, all of Albuquerque, N. Mex.

[73] Assignee: The United States of America as represented by the United States Department of Energy, Washington, D.C.

[21] Appl. No.: 400,621

[22] Filed: Aug. 30, 1989

[51] Int. Cl.$^5$ .......................... H01S 3/19; H01S 3/098
[52] U.S. Cl. ......................................... 372/50; 372/18; 372/32; 372/44
[58] Field of Search ........................ 374/18, 44, 32, 50, 374/20, 108, 97, 23

[56] References Cited

U.S. PATENT DOCUMENTS

| 4,686,485 | 8/1987 | Goldberg et al. | 330/4.3 |
| 4,751,705 | 6/1988 | Hadley et al. | 372/18 |
| 4,907,234 | 3/1990 | Goldberg et al. | 372/50 |

OTHER PUBLICATIONS

C. Lindstrom et al., "High-Power, High-Brightness, Phase-Locked Broad-Stripe Diode Lasers", *Applied Physics Letters*, vol. 53, No. 7, Aug. 15, 1988, pp. 555-556.

D. Welch et al., "High-Power, 8W CW, Single-Quantum-Well Laser Diode Array", *Elect. Lett.*, vol. 24, No. 2, 01/21/88, pp. 113-115.

L. Goldberg et al., "Injection Locking of Coupled-Stripe Diode Laser Arrays", *Applied Physics Letters*, vol. 46, No. 3, 02/01/85, pp. 236-238.

J. Hohimer et al., "Single-Channel Injection Locking of a Diode-Laser Array with a CW Dye Laser", *Applied Physics Letters*, vol. 47, No. 12, Dec. 15, 1985, pp. 1244-1246.

L. Goldberg et al., "Injection Locking and Single-Mode Fiber Coupling of a 40-Element Laser Diode Array", *Applied Physics Letters*, vol. 50, No. 24, Jun. 15, 1987, pp. 1713-1715.

D. Wagner et al., "Operating Characteristics of Single-Quantum-Well AlGaAs/GaAs High-Power Lasers", *IEEE Journal of Quantum Electronics*, vol. 24, No. 7, Jul. 1988, pp. 1258-1264.

S. Corzine et al., "Continuous Tunability in Three-Terminal Coupled-Cavity Lasers", *Applied Physics Letters*, vol. 48, No. 18, May 5, 1986, pp. 1190-1192.

R. Defreez et al., "CW Operation of Widely and Continuously Tunable Micromachined-Coupled-Cavity Diode Lasers", *Electronics Letters*, vol. 22, No. 17, Aug. 14, 1986, pp. 919-921.

Murata et al., "Frequency Modulation and Spectral Characteristics for a 1.5 $\mu$m Phase-Tunable DBF Laser", *Electronics Letters*, vol. 23, No. 1, Jan. 2, 1987, pp. 12-14.

T. Numai et al., "1.5 $\mu$m Wavelength Tunable Phase--Shift Controlled Distributed Feedback Laser Diode with Constant Spectral Linewidth in Tuning Operation", *Electronics Letters*, vol. 24, No. 24, Nov. 24, 1988, pp. 1526-1528.

G. Hadley et al., "Modeling of Injection-Locking Phenomena in Diode-Laser Arrays", *Optics Letters*, vol. 11, No. 3, Mar. 1986, pp. 144-146.

*Primary Examiner*—Georgia Epps
*Attorney, Agent, or Firm*—Anne D. Daniel; James H. Chafin; William R. Moser

[57] ABSTRACT

A continuous wave integrated injection-locked high-power diode laser array is provided with an on-chip independently-controlled master laser. The integrated injection locked high-power diode laser array is capable of continuous wave lasing in a single near-diffraction limited output beam at single-facet power levels up to 125 mW (250 mW total). Electronic steering of the array emission over an angle of 0.5 degrees is obtained by varying current to the master laser. The master laser injects a laser beam into the slave array by reflection of a rear facet.

22 Claims, 5 Drawing Sheets

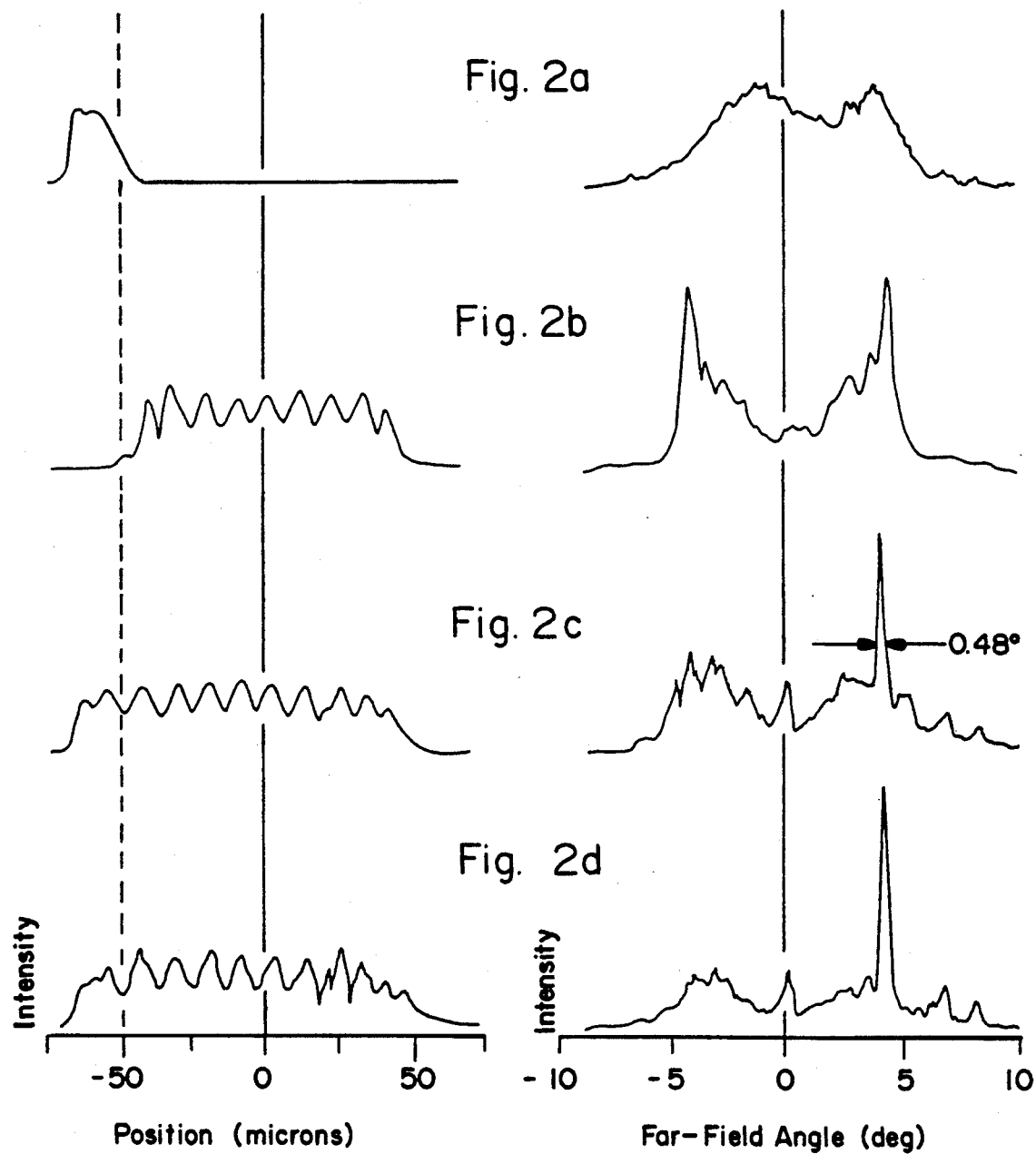

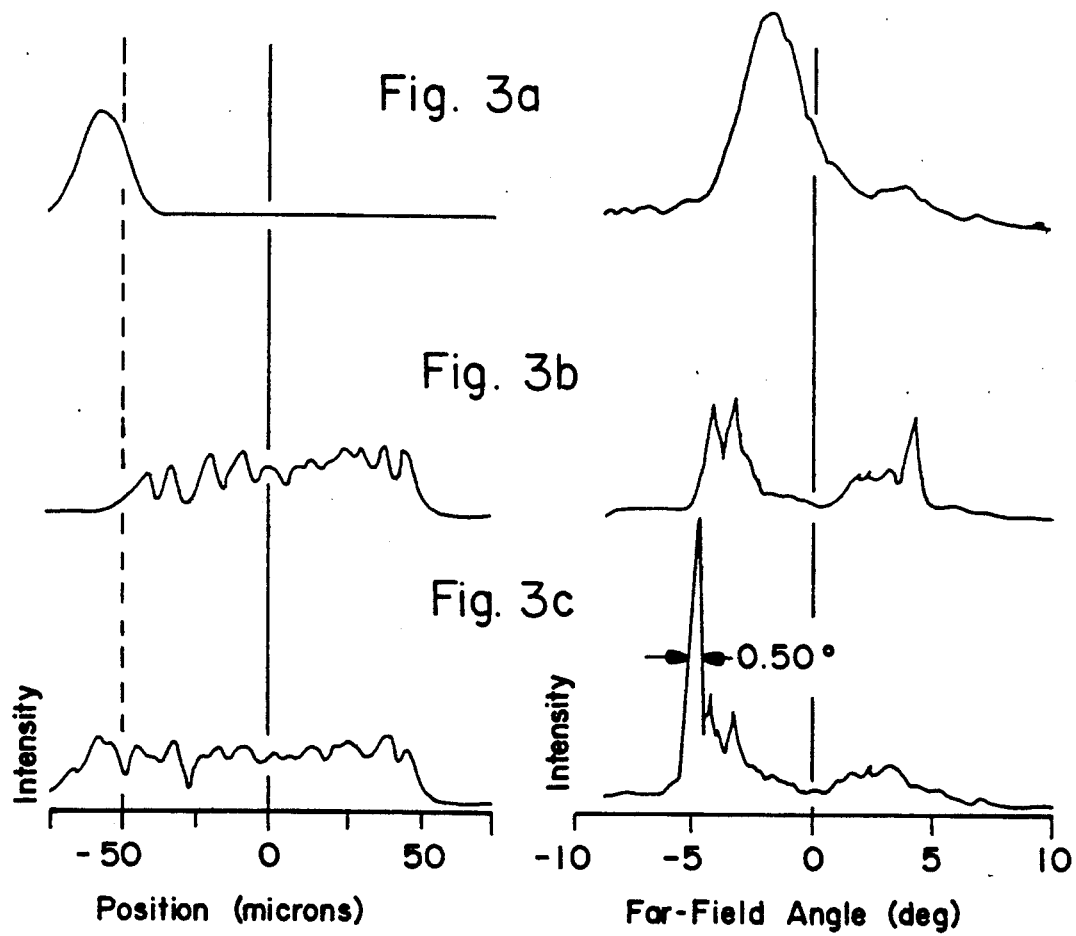

Fig. 4a
Fig. 4b
Fig. 4c
Fig. 4d
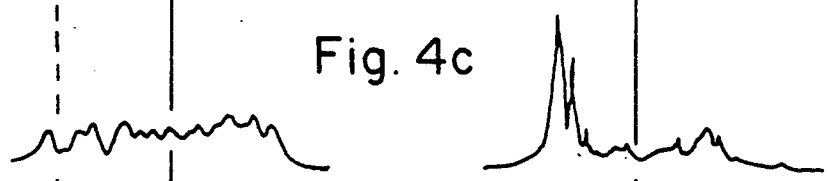
Fig. 4e
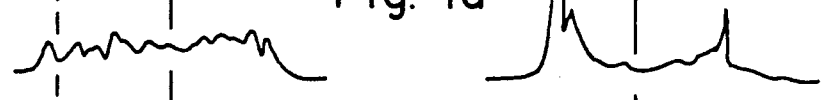
Fig. 4f
Fig. 4g
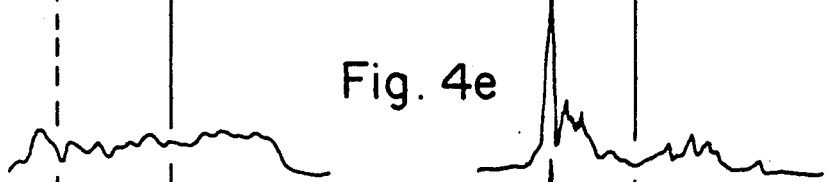
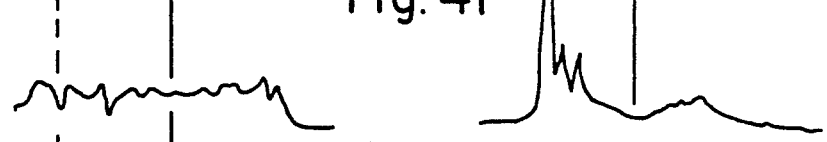
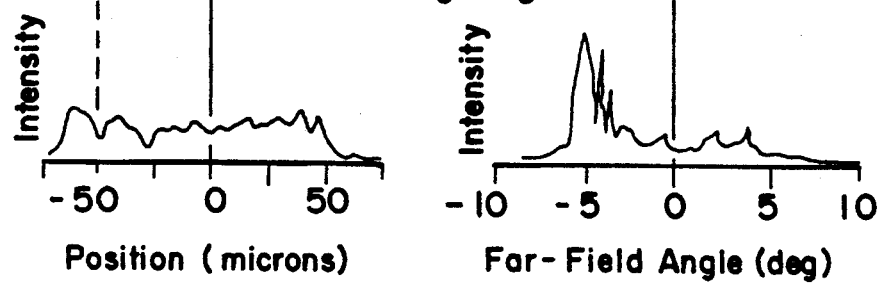
Position (microns)      Far-Field Angle (deg)

INTEGRATED INJECTION-LOCKED SEMICONDUCTOR DIODE LASER

BACKGROUND OF THE INVENTION

The present invention relates generally to semiconductor diode lasers and more particularly to an integrated injection-locked semiconductor diode laser comprising a master laser and a slave array integrated on the same chip. The Government has rights in this invention pursuant to Contract No. DE-AC04-76DP00789 awarded by the U.S. Department of Energy to AT&T Technologies, Inc.

A fundamental requirement of high-power diode lasers is for emission in a single near-diffraction-limited output beam so that the laser can be focussed tightly or propagated over long distances. However, gain-guided semiconductor diode laser arrays generally emit their radiation in a twin-lobed far-field beam in the direction parallel to the active layer. Such a twin-lobed output beam limits the ability of the laser radiation to be focused tightly or to be propagated over long distances.

Injection locking by an external master laser has been demonstrated to be an effective means of converting the twin-lobed emission from a diode array into a single near-diffraction-limited beam. However, known methods of injection locking require the addition of an external well-controlled master laser, an optical isolator and focusing lenses all of which are inconvenient and expensive. Further, the use of external injection is also difficult to implement and produces a device which is not compact or physically and thermally stable.

Semiconductor diode lasers provide an efficient intense source of laser radiation and therefore have applications in areas such as optical radar, satellite communication, laser printers, etc. Continuous wave (CW) output powers of several Watts can be achieved by using a broad-area or an array geometry. Lindstrom et al, Appl. Phys. Lett. 53, 555 (1988) disclose high-power broad-area lasers with cavity lengths of 500 $\mu$m and widths of 200 $\mu$m. Welch et al, Electron. Lett. 24, 113 (1988) disclose a high-power laser utilizing an array geometry. However, these devices generally emit their radiation in a twin-lobed far-field beam which limits their ability to be focused tightly or to be propagated over long distances.

Thus, attempts have been made to convert the twin-lobed emission into a single near-diffraction-limited beam. U.S. Pat. No. 4,686,485 to Goldberg et al and U.S. Pat. No. 4,751,705 to Hadley et al disclose injection locking of diode-laser arrays to convert the twin-lobed emission into a single near-diffraction-limited beam. Injection locking has also been proposed by Goldberg et al, Appl. Phys. Lett. 46, 236 (1985), Hohimer et al, Appl. Phys. Lett. 47, 1244 (1985), and Goldberg et al, Appl. Phys. Lett. 50, 1713 (1987). However, these devices suffer from the disadvantage that an external well-controlled master laser, optical isolator and focusing lenses are required.

Therefore, a practical device for a semiconductor laser is desired which is physically and thermally stable and which does not require external means to convert the twin-lobed emission into a single near-diffraction-limited beam.

SUMMARY OF THE INVENTION

The present invention overcomes the above-identified shortcomings of the prior art by providing an integrated master laser and slave array on the same chip while minimizing feedback effects to the master laser.

According to a feature of the present invention, a continuous wave integrated injection-locked high-power diode laser array is provided with an on-chip independently-controlled master laser. The integrated injection-locked semiconductor diode laser of the present invention is capable of continuous wave lasing in a single near-diffraction-limited output beam at single-facet power levels up to 125 mW (250 mW total). Further, the present invention is capable of electronic steering of the array emission over an angle of 0.5 degrees by varying the current to the master laser.

The present invention permits the cost of manufacture to be reduced and production increased because less epitaxial material is used in making the devices due to the master laser and slave array being located side-by-side on the same size chip as would be required for the array alone.

A further advantage of the present invention stems from the end-facet mirrors of both the master laser and slave array being formed by the same cleaving step, allowing for the cleaves to be easily inspected.

Further, misalignment of the relative positions of the master laser and slave array is avoided in the mounting and bonding processes due to the present configuration.

Yet a further advantage of the present invention is that the master laser and slave array can be independently tested and characterized because both the master laser and slave array have equal optical access, and can be independently driven.

It is therefore an object of the present invention to provide an integrated injection-locked semiconductor diode laser which is self-aligned and more rugged than previously known injection-locked lasers.

It is a further object of the present invention to provide feedback isolation by locating the master laser on one side of the slave array.

It is another object of the present invention to provide a device which does not require critical gap spacing or multiple-cavity effects.

It is also an object of the present invention to provide a laser in which the injection power level can be controlled by applying facet coatings to the rear facet where reflection-injection occurs.

It is yet another object of the present invention to allow facet coatings to be easily applied.

These and other objects, features and advantages of the present invention will be seen more clearly by reference to the following detailed specification and to the appended drawings.

BRIEF DESCRIPTION OF THE DRAWINGS

FIGS. 2(a)–(d) show near- and far-field emission profiles from one embodiment of the integrated injection-locked array of the present invention.

FIGS. 3(a)–(c) show near- and far-field emission profiles from another embodiment of the integrated injection-locked array of the present invention.

FIGS. 4(a)–(g) show near- and far-field emission profiles of the integrated injection-locked array of the present invention in which the slave array current is fixed while the master laser current is varied.

DETAILED DESCRIPTION OF THE PREFERRED EMBODIMENTS

Figure 1B:
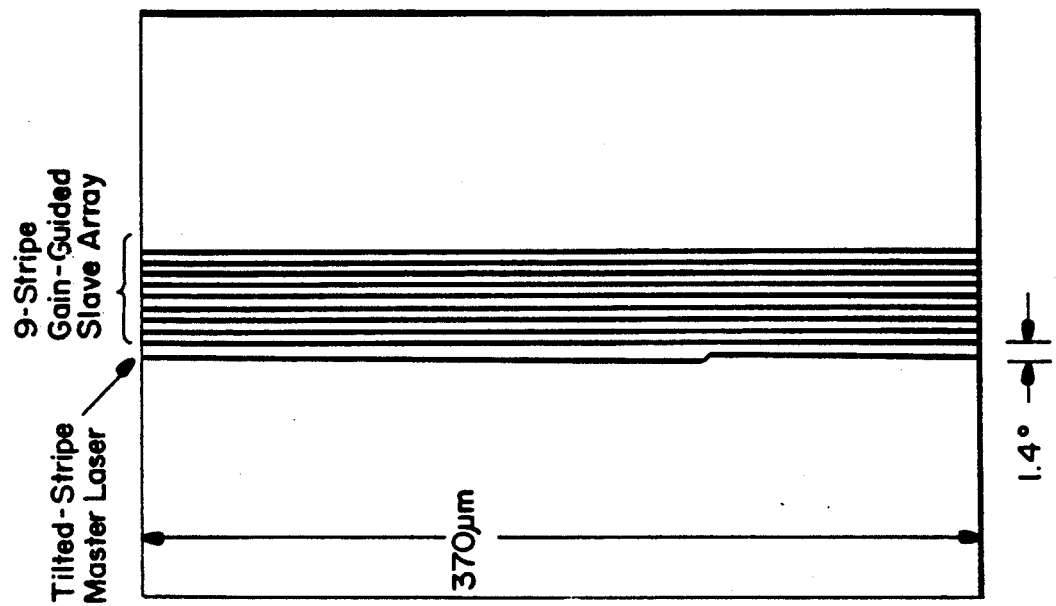
FIGS. 1(a) and 1(b) are schematic diagrams showing two configurations of the integrated injection-locked diode laser array of the present invention.
Figure 1A:
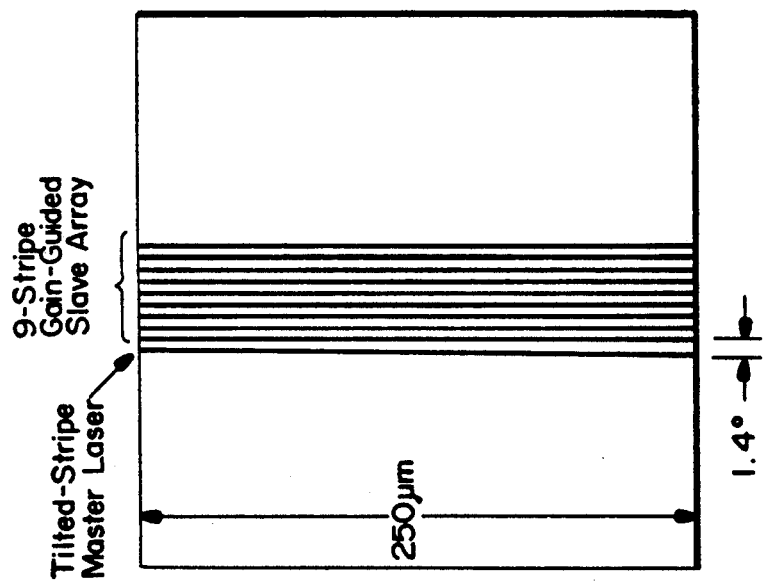

Referring to FIGS. 1(a) and 1(b), two configurations of an integrated injection-locked diode laser array of the present invention are shown. FIG. 1(a) shows an injection-locked diode laser array with a cavity length of 250 $\mu$m. FIG. 1(b) shows an array with a cavity length of 370 $\mu$m. The arrays shown in FIGS. 1(a) and 1(b) utilize a reflection-injection scheme in which an isolated single-channel master laser is located on one side of a high-power slave array. The master laser is tilted slightly off-axis to inject the slave array via reflection from a rear facet of the array. The tilt angle of the master laser is chosen to match the internal angle of the free-running slave array emission for optimum injection locking. In the present embodiment, a tilt angle of 1.4 degrees is chosen for a 250 $\mu$m cavity length and 10 $\mu$m inter-element spacing. The tilt angle is chosen based on the cavity length and the array element spacing. For longer cavity lengths and/or closer inter-element spacings, the tilt angle would be reduced. Thus, a preferred range of tilt angle is from about 0.5 to about 2 degrees.

The gain-guided slave array portion of the laser is a single-quantum-well graded-index separate-confinement-heterostructure (GRIN-SCH) design with nine stripes. The stripes are six $\mu$m wide with 10 $\mu$m center-to-center spacing. The tilted master laser comprises a single stripe. The isolated single-stripe gain-guided master laser uses the same GRIN-SCH structure and is six $\mu$m wide. Of course, the number of array stripes can be varied as well as their dimensions.

The wafer is grown by conventionally known methods. A preferred method for growing a single-quantum-well GRIN-SCH structure for the injection locked array is by molecular beam epitaxy on a (100)-oriented, Si-doped GaAs substrate. In this method, a 1.0- $\mu$m GaAs:Si buffer layer ($8 \times 10^{17}$cm$^{-3}$) is initially grown followed by a short-period GaAs/AlAs superlattice (25 angstrom layers, 20 periods, $8 \times 10^{17}$cm$^{-3}$ Si); a 1.5- $\mu$m Al$_{0.60}$Ga$_{0.40}$As:Si ($5 \times 10^{17}$cm$^{-3}$) optical confinement layer; a 0.2- $\mu$m Al$_x$Ga$_{1-x}$As undoped linearly graded (x=0.6−0.2) layer; a single 50 angstrom undoped GaAs quantum well; a 0.2- $\mu$m Al$_x$Ga$_{1-x}$As undoped linearly graded (x=0.2−0.6) layer; a 1.5 $\mu$m Al$_{0.60}$Ga$_{0.40}$As:Be ($8 \times 10^{17}$cm$^{-3}$) optical confinement layer and a 500 angstrom GaAs:Be ($1 \times 10^{19}$cm$^{-3}$) surface cap layer. Other epitaxial growth techniques including MOCVD and LPE as well as other material systems and other epitaxial layer structures are applicable to the present invention.

After growth, a patterned Be/Au metalization (1- $\mu$m thick) is deposited as an implant mask and the wafer is proton implanted (100 keV, $3 \times 10^{15}$ cm$^2$) to define the current stripes and to provide electrical isolation between the slave array and the master laser. Effective electrical isolation of the master laser and slave array is achieved by the same ion implantation step used to define the lasing stripes. The use of junction-up mounting, such as described in Wagner et al, IEEE J. Quantum Electron., QE-24,1258 (1988), allows independent electrical contacting of the master laser and slave array while still permitting efficient high-power continuous wave operation. A patterned Ti/Au metalization is deposited to connect the Be/Au current stripes of the slave array and to form bonding pads for independently contacting the slave array and master laser. Other metalizations such as Au/Zn can be used for the implant mask provided they form an ohmic contact with the p-doped surface cap layer of the epitaxial structure. The second-level metalization connects the current stripes and can be of any metal composition which has the properties of low sheet resistance, good adhesion and good wire bonding characteristics. These metals include, for example, Au/Zn, Ti/Pt/Au, Cr/Au, Ti/Au, Ni/Ge/Au. Devices with uncoated facets were formed by cleaving, and mounted junction-up on Cu heat sinks with indium solder.

The 250-$\mu$m-long device in FIG. 1(a) corresponds to the repetition in the photomask pattern. The 370-$\mu$m-long device shown in FIG. 1(b) has a lateral discontinuity in the master laser stripe pattern due to the repetition of the photomask pattern. This lateral discontinuity may be utilized as an additional injection point into the slave array.

The devices shown in FIG. 1 were operated continuous wave at 17° C. Under these conditions, the threshold current was typically 50–70 mA for the master laser and 80–120 mA for the slave array.

The configuration of the present invention has a number of advantages over alternative end-injected schemes. The present configuration is self-aligned and more rugged because both the master laser and slave array are on the same chip. Better feedback isolation is afforded by locating the master laser on the side of the slave array where feedback will be largely limited to the end channel of the slave array. The present embodiment does not require critical gap spacing or multiple cavity effects (as in the case of cleaved-coupled-cavity lasers) since the injected wave is reflected into the slave array at the facet interface. Further, the injection power level can be controlled by applying facet coatings to the rear facet where the reflection-injection occurs. The present configuration further allows high reflectivity facet coatings to be easily applied to the rear facet of the slave array and master laser, thereby increasing the power level emerging from the front facet. In addition, the slave array and master laser are thermally matched due to their closer proximity and common thermal environment.

FIGS. 2(a)–(d) show the near- and far-field emission patterns of the individually-operated 250- $\mu$m-long master laser and slave array, and those of the combined integrated injection-locked array. FIG. 2(a) shows the emission from the master laser only operating at 60 mA continuous wave (1.1x $I_{threshold}$, 2.5 mW/facet output power). FIG. 2(b) shows the emission from the 9-channel slave array operated alone at 236 mA (2.0x $I_{threshold}$, 70 mW/facet). The slave array operates in an out-of-phase mode by itself giving rise to a twin-lobed far-field pattern.

FIG. 2(c) shows the emission from the integrated injection-locked array with the slave array current at 236 mA continuous wave and the master laser current at 52 mA (73 mW/facet). As can be seen from FIG. 2(c), injection from the master laser has a dramatic effect on the far-field pattern, producing a strong near-diffraction-limited emission lobe at +4.4 degrees (in the reflection-injection direction) and suppressing the lobe at −4.4 degrees. The corresponding near-field intensity distribution shows good uniformity across both the slave array and master laser with no evidence of a gain imbalance. More complete locking of this device (by increasing the current to the master laser) was not possible due to a mismatch between the master laser wavelength and the lock band of the slave array. However, with external injection into the master laser from a tunable single-frequency continuous wave dye laser (for example, 5.6 mW incident on the front facet of the master laser), the master laser can be forced to operate single frequency with its wavelength independently tuned. This produces a substantial increase in the intensity of the single far-field lobe, more effectively suppresses the array emission at all other angles as shown in FIG. 2(d) and converts the array output from a multilongitudinal mode to single-frequency operation.

Thus, FIGS. 2(a)-(d) clearly demonstrate the viability of an integrated injection-locked diode laser array, and also show that the performance of such a device can be enhanced by the incorporation of means for single-frequency operation and independent wavelength control. These means include, for example, incorporating a separate-contact wavelength tuning section of the cleaved-coupled-cavity variety, such as described in Corzine et al, Appl. Phys. Lett. 48, 1190 (1986) and Defreez et al, Electron. Lett. 22, 919 (1986), or of the distributed-feedback variety, such as described in Murata et al, Electron. Lett. 23, 12 (1987) and Numai et al, Electron. Lett. 24, 1526 (1988).

FIG. 3 shows the near- and far-field emission profiles from the 370-$\mu$m-long integrated injection-locked array of FIG. 1(b). FIG. 3(a) shows the emission from the master laser operated alone at 100 mA continuous wave (1.4 x $I_{threshold}$, 12 mW/facet). The far-field emission shown in FIG. 3(a) in the reflection-injection direction (at +3.9 degrees) is much weaker than that for the 250-$\mu$m-long integrated injection-locked array shown in FIG. 2(a). FIG. 3(b) shows the emission from the slave array operated alone at 276 mA continuous wave (3.0 x $I_{threshold}$, 118 mW/facet, 37% d.c. power conversion efficiency). There is a slight asymmetry in the emission from the slave array with a preference toward emission in the same direction as the master laser (i.e., at negative far-field angle).

The performance of the integrated injection-locked array is shown in FIG. 3(c) with the slave array operating at 276 mA continuous wave and the master laser at 77 mA continuous wave (125 mW/facet). Injection locking of the slave array produces an intense near-diffraction-limited (0.50 degree FWHM) lobe at $-4.9$ degrees. This lobe occurs in the preferred emission direction of both the master laser and slave array, and is oppositely directed from that of the 250-$\mu$m-long device. This difference in emission direction may be the result of the slight gain imbalance of the 370-$\mu$m-long device and/or injection from the master laser at the point of the discontinuity in the photomask pattern.

Referring now to FIGS. 4(a)-4(g), the continuous wave behavior is shown for the 370-$\mu$m-long integrated injection-locked array when the slave array current is fixed at 276 mA and the master laser current varied over the range from 0 to 99 mA. The control of the master laser over the slave array far-field emission is immediate even at 9 mA current as shown in FIG. 4(b). Although this current is well below the continuous wave lasing threshold (72 mA) for the master laser operated alone, lateral carrier diffusion from the slave array allows the master laser to lase in the combined mode of operation. This is evidenced by the emergence of a lasing peak in the near-field at the location of the master laser. As the master laser current is increased, a further narrowing of the far-field pattern occurs indicating more complete locking of the slave array. At a master laser current of 48 mA, the far-field emission is concentrated into a near-diffraction-limited (0.48 degrees FWHM) single-lobe as shown in FIG. 4(d). Optimum locking of the array occurs for master laser currents in the range of 48-77 mA as shown in FIGS. 4(d)-(f) for which a single-lobed ($\leq$0.5 degree FWHM) far-field pattern is obtained. FIG. 4(g) shows that as the master laser current is further increased, its wavelength is tuned to the edge of the lock band of the slave array and the far-field pattern broadens. At a master laser current of 99 mA, the continuous wave output power of the integrated injection-locked device is 130 mW/facet (260 mW total) and the overall d.c. power conversion efficiency (slave array plus master laser) is 32%.

FIGS. 4(a)-(g) show the control which the master laser exerts over the emission angle of the injection-locked array. Previous injection-locking studies have shown that when the injection frequency in a gain-guided diode laser array is varied, the wave front in the array tilts in order to maintain its Fabry-Perot resonance condition. Thus, electronic steering of the far-field emission angle in the present invention is possible simply by current tuning the wavelength of the master laser. Alternatively, an independent wavelength control, of the cleaved-coupled-cavity or distributed-feedback variety, could be incorporated into the master laser to provide wavelength tuning without varying the injected power level into the slave array. Increasing the master laser current from 35 to 77 mA results in a change in the far-field emission angle of $-0.50$ degrees ($-4.36$ to $-4.86$ degrees) for an electronic steering rate of $-1.2\times10^{-2}$ deg/mA. The angular steering range could be increased by reducing the cavity length of the device and/or by increasing the injected power level from the master laser by adding rear-facet coatings. Varying the current to the slave array will also steer the far-field emission angle, but at a much smaller rate (due to current division among the slave array stripes) and in an opposing direction. With the master laser current at 46 mA continuous wave and the slave array current varied from 173 to 284 mA (1.87$-$3.07 x $I_{threshold}$), a change in the far-field angle of only $+0.12$ degrees was measured for a slave array steering rate of $+1.1\times10^{-3}$ deg/mA, an order of magnitude smaller than that obtained by current tuning the master laser.

Figure 5B:
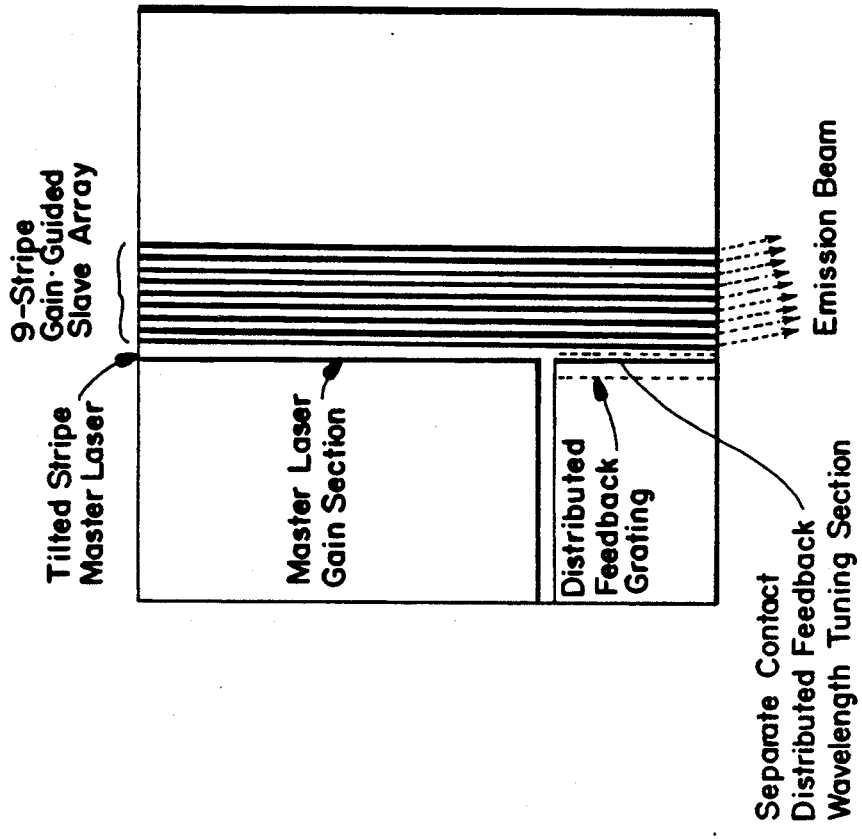
FIGS. 5(a) and 5(b) are schematic diagrams showing a cleaved-coupled-cavity master laser and a distributed-feedback master laser.
Figure 5A:
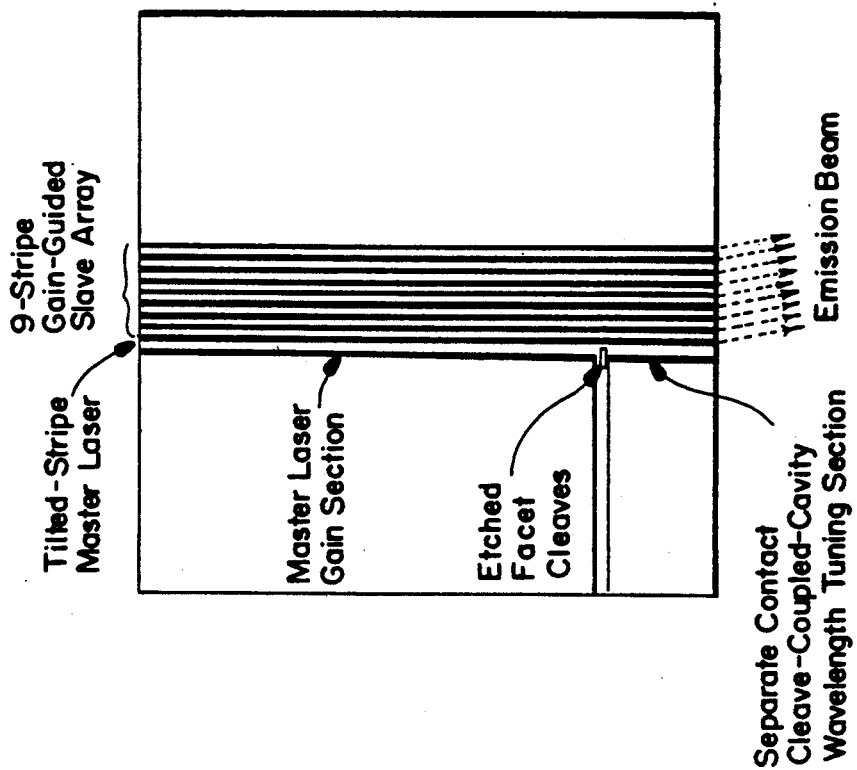

FIGS. 5(a) and (b) show embodiments of the present invention in which the on-chip master laser can be operated single-frequency and be wavelength tunable. In these embodiments, the operation of the master laser is converted to single frequency operation, and produces a single-frequency output from the slave array without any need for external injection. The addition of a cleaved-coupled-cavity or distributed-Bragg-reflector section to the master laser further enhances its performance by allowing the injection wavelength and injected power level to be independently varied. This allows the array output wavelength to be tuned over a range of 10 nm or more corresponding to the width of the array gain profile. The ability to independently control the injection wavelength by a separate tuning section (cleaved-coupled-cavity or distributed-Bragg-reflector) has the added advantage of increasing the angular steering rate (degrees/Amp) and speed (degrees/second) of the array output. The ability afforded by these embodiments to independently control the injected power level will further enhance the performance of the integrated injection-locked array by converting more of the twin-lobed array emission into the single-lobed output beam, increasing the injection locking range of the slave array, and increasing the angle over which the output beam can be electronically steered from the above-described 0.5 degrees to about 2 or more degrees.

In FIG. 5(a), the use of a cleaved-coupled-cavity master laser is shown. FIG. 5(b) shows a distributed-feedback master laser. These devices vastly improve the spectral coherence of the array emission, which may be useful in such areas as interferometry, communications and optical radar.

It should be noted that the above-described diode laser can also apply to larger 1- and 2- dimensional arrays, as well as broad-area diode lasers.

The present invention allows for integrated injection locking of high-power arrays, and demonstrates that feedback may not be a limiting factor in the development of these integrated devices. By integrating an on-chip master laser with a high-power slave array, the spatial coherence of the array emission is vastly improved, thereby greatly increasing its range of applications. The integrated device of the present invention can be electronically steered, thereby opening up new potential applications.

While the present invention has been described with reference to particular preferred embodiments, the invention is not limited to the specific examples given, and other embodiments and modifications can be made by those skilled in the art without departing from the spirit and scope of the invention.

What is claimed is:

1. A semiconductor laser apparatus, comprising:
   a slave array of semiconductor laser elements, and
   a master laser, integrated on one semiconductor chip with said slave array, for producing a laser beam and for controlling said slave array to produce a single, phase-locked, steerable emission beam from said slave array.

2. The semiconductor laser apparatus of claim 1, wherein the master laser injects said laser beam into the slave array by reflection at a facet interface.

3. The semiconductor laser apparatus of claim 1, wherein said slave array is a diode laser array.

4. The semiconductor laser apparatus of claim 3, wherein said slave array is a stripe geometry gain-guided diode laser array.

5. The semiconductor laser apparatus of claim 4, wherein said slave array is a single-quantum-well graded-index separate-confinement-heterostructure with nine stripes.

6. The semiconductor laser apparatus of claim 1, wherein said master laser is an isolated single channel master laser.

7. The semiconductor laser apparatus of claim 1, wherein said master laser and said slave array are independently controlled.

8. The semiconductor laser apparatus of claim 1, wherein said master laser and slave array have a cavity length which corresponds to a repetition of a photomask pattern.

9. The semiconductor laser apparatus of claim 8, wherein said cavity length is 250 $\mu$m.

10. The semiconductor laser apparatus of claim 1, wherein said master laser and slave array have a cavity length which provides a lateral discontinuity in the master laser.

11. The semiconductor laser apparatus of claim 1, wherein said cavity length is 370 $\mu$m.

12. The semiconductor laser apparatus of claim 1, further comprising means for external injection of a second laser beam.

13. The semiconductor laser apparatus of claim 12, wherein said means is a tunable single-frequency continuous wave dye laser.

14. The semiconductor laser apparatus of claim 1, wherein said master laser is arranged at a tilt angle which matches an internal angle of a free-running emission of said slave array.

15. The semiconductor laser apparatus of claim 14, wherein said tilt angle ranges from about 0.5 to about 2 degrees.

16. The semiconductor laser apparatus of claim 14, wherein said tilt angle is about 1.4 degrees.

17. The semiconductor laser apparatus of claim 1, wherein an array emission beam is electronically steered by varying current to the master laser.

18. The semiconductor laser apparatus of claim 1, wherein said master laser is operated single-frequency and made wavelength tunable by external injection of a second laser beam thereby generating a single-frequency wavelength tunable output from the slave array.

19. The semiconductor laser apparatus of claim 1, wherein said master laser and slave array are operated single-frequency and made wavelength tunable by incorporating into the master laser a separate-contact cleave-coupled-cavity structure.

20. The semiconductor laser apparatus of claim 1, wherein said master laser and slave array are operated single-frequency and made wavelength tunable by incorporating into the master laser a separate-contact distributed-Bragg-reflector structure.

21. A method for converting a twin-lobed far-field emission into a single near-diffraction-limited output beam, comprising the steps of:
   (a) providing a slave array which gives rise to a twin-lobed far-field emission when operated alone;
   (b) integrating a master laser, which is operably attached to a source of current and which produces a laser beam, on one semiconductor chip with said slave array;
   (c) injecting said laser beam from said master laser into said slave array, via reflection from a rear facet of said slave array; and
   (d) varying the current from said source of current to said master laser to control said slave array, such that said twin-lobed far-field emission is converted into a single near-diffraction-limited output beam.

22. A method for converting a multi-longitudinal-mode emission into a single-longitudinal-mode output beam, comprising the steps of:
   (a) providing a slave array which gives rise to a multi-longitudinal-mode emission when operated alone;
   (b) integrating a master laser, which is operably attached to a source of current and which produces a single-frequency laser beam, on one semiconductor chip with said slave array;
   (c) injecting said single-frequency laser beam from said master laser into said slave array, via reflection from a rear facet of said slave array; and
   (d) varying the current from said source of current to said master laser to control the frequency of said slave array, such that said multi-longitudinal-mode emission is converted into a single-longitudinal-mode output beam.

* * * * *